United States Patent
Kneer et al.

(10) Patent No.: US 10,626,353 B2
(45) Date of Patent: Apr. 21, 2020

(54) CLEANING FORMULATIONS

(71) Applicant: Fujifilm Electronic Materials U.S.A., Inc., N. Kingstown, RI (US)

(72) Inventors: Emil A. Kneer, Mesa, AZ (US); Yasuo Sugishima, Gilbert, AZ (US)

(73) Assignee: Fujifilm Electronic Materials U.S.A., Inc., N. Kingstown, RI (US)

(*) Notice: Subject to any disclaimer, the term of this patent is extended or adjusted under 35 U.S.C. 154(b) by 172 days.

(21) Appl. No.: 15/890,398

(22) Filed: Feb. 7, 2018

(65) Prior Publication Data

US 2018/0230405 A1  Aug. 16, 2018

Related U.S. Application Data

(60) Provisional application No. 62/457,293, filed on Feb. 10, 2017.

(51) Int. Cl.
| | | |
|---|---|---|
| *C11D 7/32* | (2006.01) | |
| *C11D 3/30* | (2006.01) | |
| *C11D 3/43* | (2006.01) | |
| *C11D 3/04* | (2006.01) | |
| *H01L 21/02* | (2006.01) | |
| *C11D 3/34* | (2006.01) | |
| *C11D 3/20* | (2006.01) | |
| *C11D 7/08* | (2006.01) | |
| *C11D 7/22* | (2006.01) | |
| *C11D 7/50* | (2006.01) | |
| *C11D 11/00* | (2006.01) | |
| *C11D 3/16* | (2006.01) | |
| *C11D 7/06* | (2006.01) | |

(52) U.S. Cl.
CPC ............... *C11D 3/30* (2013.01); *C11D 3/042* (2013.01); *C11D 3/044* (2013.01); *C11D 3/166* (2013.01); *C11D 3/2075* (2013.01); *C11D 3/3409* (2013.01); *C11D 3/43* (2013.01); *C11D 7/06* (2013.01); *C11D 7/08* (2013.01); *C11D 7/22* (2013.01); *C11D 7/5009* (2013.01); *C11D 7/5022* (2013.01); *C11D 11/0047* (2013.01); *H01L 21/0206* (2013.01); *H01L 21/02068* (2013.01); *H01L 21/02071* (2013.01)

(58) Field of Classification Search
CPC .................................................. C11D 11/0047
USPC .................................................. 510/175, 176
See application file for complete search history.

(56) References Cited

U.S. PATENT DOCUMENTS

| | | | |
|---|---|---|---|
| 3,978,010 A | 8/1976 | Bright et al. | |
| 6,306,807 B1 | 10/2001 | Wojtczak et al. | |
| 7,119,052 B2 | 10/2006 | Korzenski et al. | |
| 9,396,926 B2 | 7/2016 | Mizutani et al. | |
| 9,562,211 B2 | 2/2017 | Takahashi et al. | |
| 10,415,005 B2 * | 9/2019 | Takahashi | C11D 7/3281 |
| 2007/0060490 A1 * | 3/2007 | Skee | C11D 3/0073 510/175 |
| 2015/0159125 A1 | 6/2015 | Kneer | |
| 2016/0130500 A1 * | 5/2016 | Chen | C11D 3/30 216/13 |
| 2017/0335248 A1 * | 11/2017 | Oie | C11D 7/02 |
| 2018/0204736 A1 * | 7/2018 | White | H01L 21/02065 |

FOREIGN PATENT DOCUMENTS

| | | |
|---|---|---|
| CN | 101907835 | 12/2010 |
| WO | WO 2008/157345 | 12/2008 |

OTHER PUBLICATIONS

The International Search Report and Written Opinion of the International Searching Authority for International Application No. PCT/US18/17159 dated Apr. 26, 2018 (9 pages).
"Redox Indicator", Wikipedia, pp. 1-2, Nov. 7, 2015.
The International Preliminary Report on Patentability for International Application No. PCT/US2018/017159 dated Aug. 22, 2019.

\* cited by examiner

*Primary Examiner* — Gregory E Webb
(74) *Attorney, Agent, or Firm* — Fish & Richardson P.C.

(57) ABSTRACT

This disclosure relates to a cleaning composition that contains 1) at least one redox agent; 2) at least one organic solvent selected from the group consisting of water soluble alcohols, water soluble ketones, water soluble esters, water soluble sulfones, and water soluble ethers; 3) at least one boron-containing compound selected from the group consisting of boric acid, boronic acids, and salts thereof; and 4) water.

37 Claims, No Drawings

CLEANING FORMULATIONS

CROSS-REFERENCE TO RELATED APPLICATION

The present application claims priority to U.S. Provisional Application Ser. No. 62/457,293, filed on Feb. 10, 2017, which is herein incorporated by reference in its entirety.

FIELD OF THE DISCLOSURE

The present disclosure relates to novel cleaning compositions for semiconductor substrates and methods of cleaning semiconductor substrates. More particularly, the present disclosure relates to cleaning compositions for semiconductor substrates after plasma etching of metal layers or dielectric material layers deposited on the substrates and the removal of residues left on the substrates after bulk resist removal via a plasma ashing process.

BACKGROUND OF THE DISCLOSURE

In the manufacture of integrated circuit devices, photoresists are used as an intermediate mask for transferring the original mask pattern of a reticle onto the wafer substrate by means of a series of photolithography and plasma etching steps. One of the essential steps in the integrated circuit device manufacturing process is the removal of the patterned photoresist films from the wafer substrate. In general, this step is carried out by one of two methods.

One method involves a wet stripping step in which the photoresist-covered substrate is brought into contact with a photoresist stripper solution that consists primarily of an organic solvent and an amine. However, such stripper solutions generally cannot completely and reliably remove the photoresist films, especially if the photoresist films have been exposed to UV radiation and plasma treatments during fabrication. Some photoresist films become highly cross-linked by such treatments and are more difficult to dissolve in a stripper solution. In addition, the chemicals used in these conventional wet-stripping methods are sometimes ineffective for removing inorganic or organometallic residual materials formed during the plasma etching of metal or oxide layers with halogen-containing gases.

An alternative method of removing a photoresist film involves exposing a photoresist-coated wafer to oxygen-based plasma in order to burn the resist film from the substrate in a process known as plasma ashing. However, plasma ashing is also not fully effective in removing the plasma etching by-products noted above. Instead, removal of these plasma etch by-products is typically accomplished by subsequently exposing the processed metal and dielectric thin films to certain cleaning solutions.

Metal-containing substrates are generally susceptible to corrosion. For example, substrates such as aluminum, copper, aluminum-copper alloy, tungsten nitride, tungsten (W), cobalt (Co), titanium oxide, other metals and metal nitrides, will readily corrode. Further, dielectrics (e.g., interlayer dielectrics or ultra low-k dielectrics) in the integrated circuit devices can be etched by using conventional cleaning chemistries. In addition, the amount of corrosion tolerated by the integrated circuit device manufacturers is getting smaller and smaller as the device geometries shrink.

At the same time, as residues become harder to remove and corrosion must be controlled to ever lower levels, cleaning solutions should be safe to use and environmentally friendly.

Therefore, the cleaning solution should be effective for removing the plasma etch and plasma ashing residues and should also be non-corrosive to all exposed substrate materials.

SUMMARY OF THE DISCLOSURE

The present disclosure is directed to non-corrosive cleaning compositions that are useful for removing residues (e.g., plasma etch and/or plasma ashing residues) from a semiconductor substrate as an intermediate step in a multistep manufacturing process. These residues include a range of relatively insoluble mixtures of organic compounds such as residual photoresist; organometallic compounds; metal oxides such as aluminum oxides (AlOx), titanium oxides (TiOx), zirconium oxides (ZrOx), tantalum oxides (TaOx), and hafnium oxides (HfOx) (which can be formed as reaction by-products from exposed metals); metals such as aluminum (Al), aluminum/copper alloy, copper (Cu), titanium (Ti), tantalum (Ta), tungsten (W), and cobalt (Co); metal nitrides such as aluminum nitrides (AlN), aluminum oxide nitrides (AlOxNy), titanium nitrides (TiN), tantalum nitrides (TaN), and tungsten nitrides (WN); their alloys; and other materials. An advantage of the cleaning composition described herein is that it can clean a broad range of residues encountered and be generally non-corrosive to exposed substrate materials (e.g., exposed metals (such as aluminum, aluminum/copper alloy, copper, titanium, tantalum, tungsten, and cobalt), metal nitrides (such as titanium, tantalum, and tungsten nitrides), and their alloys).

In one aspect, the present disclosure features a cleaning composition containing
1) at least one redox agent;
2) at least one organic solvent selected from the group consisting of water soluble alcohols, water soluble ketones, water soluble esters, water soluble sulfones, and water soluble ethers;
3) at least one boron-containing compound selected from the group consisting of boric acid, boronic acids, and salts thereof; and
4) water.

The present disclosure also features a method of cleaning residues from a semiconductor substrate. The method includes contacting a semiconductor substrate containing post etch residues and/or post ashing residues with a cleaning composition described herein. For example, the method can include the steps of:
(A) providing a semiconductor substrate containing post etch and/or post ashing residues;
(B) contacting said semiconductor substrate with a cleaning composition described herein;
(C) rinsing said semiconductor substrate with a suitable rinse solvent; and
(D) optionally, drying said semiconductor substrate by any means that removes the rinse solvent and does not compromise the integrity of said semiconductor substrate.

DETAILED DESCRIPTION OF THE DISCLOSURE

As defined herein, unless otherwise noted, all percentages expressed should be understood to be percentages by weight to the total weight of the cleaning composition. Unless otherwise noted, ambient temperature is defined to be between about 16 and about 27 degrees Celsius (° C.), such as 25° C.

The terms "layer" and "film" are used interchangeably.

As defined herein, a "water-soluble" substance (e.g., a water-soluble alcohol, ketone, ester, sulfone, or ether) refers to a substance having a solubility of at least 5% by weight in water at 25° C.

One embodiment of the present disclosure is directed to a non-corrosive cleaning composition including:

1) at least one redox agent;
2) at least one organic solvent selected from the group consisting of water soluble alcohols, water soluble ketones, water soluble esters, water soluble sulfones, and water soluble ethers;
3) at least one boron-containing compound selected from the group consisting of boric acid, boronic acids, and salts thereof; and
4) water.

In general, the cleaning compositions of this disclosure contain at least one redox agent, which is believed to aid in the dissolution of residues on the semiconductor surface such as photoresist residues, metal residues, and metal oxide residues. As used herein, the term "redox agent" refers to a compound that can induce an oxidation and/or a reduction in a semiconductor cleaning process. An example of a suitable redox agent is hydroxylamine. In some embodiments, the redox agent or the cleaning composition described herein does not include a peroxide (e.g., hydrogen peroxide).

In some embodiments, the compositions of this disclosure include at least about 0.5% by weight (e.g., at least about 1% by weight, at least about 2% by weight, at least about 3% by weight, or at least about 5% by weight) and/or at most about 20% by weight (e.g., at most about 17% by weight, at most about 15% by weight, at most about 12% by weight, or at most about 10% by weight) the redox agent.

The compositions of this disclosure contain at least one (e.g., two, three, four, or more) organic solvent selected from the group of water soluble alcohols, water soluble ketones, water soluble esters, water soluble sulfones, and water soluble ethers (e.g., glycol diethers).

Classes of water soluble alcohols include, but are not limited to, alkane diols (including, but not limited to, alkylene glycols), glycols, alkoxyalcohols (including, but not limited to, glycol monoethers), saturated aliphatic monohydric alcohols, unsaturated non-aromatic monohydric alcohols, and low molecular weight alcohols containing a ring structure (e.g., those having a molecular weight less than 500 g/mol, 400 g/mol, 300 g/mol, 200 g/mol, or 100 g/mol).

Examples of water soluble alkane diols include, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, hexylene glycol, diethylene glycol, dipropylene glycol, triethylene glycol, and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble alkylene glycol monoethers.

Examples of water soluble alkylene glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to, methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to, allyl alcohol, propargyl alcohol, 2-butenyl alcohol, 3-butenyl alcohol, and 4-penten-2-ol.

Examples of water soluble, low molecular weight alcohols containing a ring structure include, but are not limited to, tetrahydrofurfuryl alcohol, furfuryl alcohol, and 1,3-cyclopentanediol.

Examples of water soluble ketones include, but are not limited to, acetone, propanone, cyclobutanone, cyclopentanone, cyclohexanone, diacetone alcohol, 2-butanone, 2,5-hexanedione, 1,4-cyclohexanedione, 3-hydroxyacetophenone, 1,3-cyclohexanedione, and cyclohexanone.

Examples of water soluble esters include, but are not limited to, ethyl acetate, glycol monoesters such as ethylene glycol monoacetate, diethylene glycol monoacetate, and glycol monoether monoesters such as propylene glycol monomethyl ether acetate, ethylene glycol monomethyl ether acetate, propylene glycol monoethyl ether acetate, and ethylene glycol monoethyl ether acetate.

Examples of water soluble sulfones include, but are not limited to, sulfolane, dimethyl sulfone, 1,3-propane sulfone, 1,4-butane sulfone, busulfan, sulfolene, ethylmethyl sulfone, diphenyl sulfone, and methylphenyl sulfone.

Examples of water soluble ethers include, but are not limited to, alkoxyalcohols (e.g., alkylene glycol monoethers), such as those described above.

In some embodiments, the cleaning compositions of this disclosure include at least about 60% by weight (e.g., at least about 65% by weight, at least about 70% by weight, or at least about 75% by weight) and/or at most about 95% by weight (e.g., at most about 90% by weight, at most about 85% by weight, or at most about 80% by weight) the at least one organic solvent.

The cleaning compositions of the present disclosure further include water. Preferably, the water is de-ionized and ultra-pure, contains no organic contaminants and has a minimum resistivity of about 4 to about 17 mega Ohms. More preferably, the resistivity of the water is at least 17 mega Ohms.

In some embodiments, the cleaning compositions of this disclosure include at least about 5% by weight (e.g., at least about 8% by weight, at least about 12% by weight, or at least about 16% by weight) and/or at most about 28% by weight (e.g., at most about 24% by weight, at most about 20% by weight, or at most about 18% by weight) water.

In some embodiments, the cleaning compositions of this disclosure include the at least one boron-containing compound. The boron-containing compound can be selected from the group consisting of boric acid ($H_3BO_3$), boronic acids, and salts thereof. In some embodiments, the boron-containing compound can be a boronic acid of formula (I):

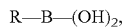
R—B—(OH)$_2$, in which R is $C_1$-$C_{10}$ alky (e.g., $C_1$-$C_4$ alky) or aryl (e.g., phenyl). An example of a boronic acid of formula (I) is phenyl boronic acid. In some embodiments, the salts of boric acid or boronic acids can be metal salts, ammonium salts, and tetraalkylammonium salts. The metal salts can be formed from an alkali metal (e.g., Li, Na, K, Rb, or Cs) or an alkaline earth metal (e.g., Mg, Ca, Sr, or Ba). The tetraalkylammonium salts can include tetramethyl ammonium cation, tetraethyl ammonium cation, tetrapropyl ammonium cation, and tetrabutyl ammonium cation.

In some embodiments, the cleaning compositions of this disclosure include at least about 0.001% by weight (e.g., at least about 0.002% by weight, at least about 0.005% by weight, at least about 0.01% by weight, at least about 0.015% by weight, at least about 0.02% by weight, at least about 0.05% by weight, or at least about 0.1% by weight) and/or at most about 0.2% by weight (e.g., at most about 0.18% by weight, at most about 0.15% by weight, at most about 0.12% by weight, at most about 0.1% by weight, or at most about 0.05% by weight) the at least one boron-containing compound. Without wishing to be bound by theory, it is believed that a cleaning composition including the boron-containing compound in the amount specified above in a cleaning composition can reduce the corrosion effects of the composition on certain exposed substrate materials (e.g., cobalt) that are not intended to be removed during the cleaning process (e.g., by lowering the etch rates of the cleaning composition on such exposed substrate materials).

The cleaning compositions of this disclosure can optionally contain at least one additive, such as metal-containing additives and cleaning additives.

Metal-containing additives contemplated for use in the cleaning compositions of the disclosure include metals selected from Group 2A metals, Group 3B metals, Group 4B metals, Group 5B metals, and lanthanide metals. In some embodiments, the metal is Ca, Ba, Ti, Hf, Sr, La, Ce, W, V, Nb, or Ta. In some embodiments, the metal is selected from Group 4B metals (such as Ti or Hf).

The metal-containing additive can be in the form of a metal halide, a metal hydroxide, a metal boride, a metal alkoxide, a metal oxide, or a metal-containing ammonium salt. In some embodiments, the metal-containing additive is an ammonium salt. The ammonium salt can be a salt of formula (I): $(NH_4)_m MX_n$ (I); in which m is 1, 2, 3, or 4; n is 1, 2, 3, 4, 5, or 6; M is a metal ion (such as an ion of a Group 2A metal, Group 3B metal, Group 4B metal, Group 5B metal, or lanthanide metal); and X is a halide ion (e.g., F, Cl, Br, or I). In certain embodiments, the metal-containing additive is ammonium hexafluorotitanate ($(NH_4)_2TiF_6$). Examples of metal-containing additives can include tungsten borides, $Ca(OH)_2$, $BaCl_2$, $SrCl_2$, $LaCl_3$, $CeCl_3$, $(NH_4)_2TiF_6$, $BaTiO_3$, $Ti(OEt)_4$, $Ti(OCH(CH_3)_2)_4$, $HfO_2$, $V_2O_5$, $Nb_2O_5$, or $TaF_3$.

In some embodiments, the metal-containing additive can be in an amount of at least about 0.001% by weight (e.g., at least about 0.002% by weight, at least about 0.004% by weight, at least about 0.006% by weight, at least about 0.008% by weight, or at least about 0.01% by weight) and/or at most about 0.5% by weight (e.g., at most about 0.4% by weight, at most about 0.3% by weight, at most about 0.2% by weight, at most about 0.1% by weight, at most about 0.08% by weight, at most about 0.06% by weight, at most about 0.04% by weight, at most about 0.02% by weight, or at most about 0.01% by weight) of the composition. Without wishing to be bound by theory, it is believed that including the metal-containing additive in the amount specified above in a cleaning composition can reduce the corrosion effects of the composition, i.e., lowering the etch rate of the cleaning composition towards the exposed substrate materials (e.g., exposed metals or dielectric materials) that are not intended to be removed during the cleaning process.

In some embodiments, the cleaning compositions of this disclosure can optionally contain at least one cleaning additive to improve their cleaning capability (e.g., removing etch or ashing residues) and/or reduce their corrosion effects. In some embodiments, the cleaning additive can be a sulfur-containing additive or an amino acid. In some embodiments, the cleaning compositions can include both a sulfur-containing additive and an amino acid.

Sulfur-containing additives contemplated for use in the cleaning compositions of the disclosure are not particularly limited. In some embodiments, the sulfur-containing additive is a molecule bearing a thiol moiety (i.e., SH) or thioether moiety (e.g., SR in which R is $C_1$-$C_{10}$ alkyl). In some embodiments, the sulfur-containing additive can be an alcohol, an acid, an amine, or a heterocyclic compound that contains a thiol or thioether moiety. Examples of sulfur-containing additives include, but are not limited to, 3-amino-5-mercapto-1H-1,2,4-triazole; β-mercaptoethanol; 3-amino-5-methylthio-1H-1,2,4-triazole; 1-phenyl-1H-tetrazole-5-thiol; 4-methyl-4H-1,2,4-triazole-3-thiol; 2-pyridinethiol; 3-mercapto-propionic acid, and the like. In some embodiments, the sulfur-containing additive may exclude sulfur-containing organic acids.

In some embodiments, the sulfur-containing additive can be in an amount of at least about 0.01% by weight (e.g., at least about 0.02% by weight, at least about 0.04% by weight, at least about 0.05% by weight, at least about 0.06% by weight, or at least about 0.08% by weight) and/or at most about 0.15% by weight (e.g., at most about 0.14% by weight, at most about 0.12% by weight, at most about 0.1% by weight, at most about 0.08% by weight, or at most about 0.07% by weight) of the composition. Without wishing to be bound by theory, it is believed that including the sulfur-containing additive in the amount specified above in a cleaning composition can improve the cleaning capability of the composition for removing post etch and/or post ashing residues and/or lower the etch rate of the cleaning composition towards the exposed substrate materials (e.g., exposed metals or dielectric materials) that are not intended to be removed during the cleaning process.

In some embodiments, the cleaning additive can include at least one amino acid (e.g., glycine). The amino acid can be a naturally occurring amino acid or a non-naturally occurring amino acid (e.g., a synthetic amino acid). The amino acid can be a D- or L-amino acid.

In some embodiments, the amino acid can be in an amount of at least about 0.01% by weight (e.g., at least about 0.02% by weight, at least about 0.04% by weight, at least about 0.05% by weight, at least about 0.06% by weight, or at least about 0.08% by weight) and/or at most about 0.15% by weight (e.g., at most about 0.14% by weight, at most about 0.12% by weight, at most about 0.1% by weight, at most about 0.08% by weight, or at most about 0.07% by weight) of the composition. Without wishing to be bound by theory, it is believed that including the amino acid in the amount specified above in a cleaning composition can improve the cleaning capability of the composition for removing post etch and/or post ashing residues and/or lower the etch rate of the cleaning composition towards the exposed substrate materials (e.g., exposed metals or dielectric materials) that are not intended to be removed during the cleaning process.

In some embodiments, the cleaning compositions of this disclosure can contain one or more organic acids. The organic acids can be used in the cleaning compositions in the presence or absence of the cleaning additive mentioned above (e.g., the sulfur-containing additive or the amino acid). Organic acids contemplated for use in the cleaning compositions of the disclosure include carboxylic acids and sulfonic acids. Exemplary carboxylic acid contemplated for use in the compositions of the disclosure include, but are not limited to, monocarboxylic acids, bicarboxylic acids, tricarboxylic acids, α-hydroxyacids and β-hydroxyacids of monocarboxylic acids, α-hydroxyacids or β-hydroxyacids of bicarboxylic acids, and α-hydroxyacids and β-hydroxyacids of tricarboxylic acids. Examples of suitable carboxylic acids include, but are not limited to, citric acid, maleic acid, fumaric acid, lactic acid, glycolic acid, oxalic acid, tartaric acid, succinic acid, and benzoic acid. Examples of sulfonic acids include, but are not limited to, methanesulfonic acid, trifluoromethanesulfonic acid, ethanesulfonic acid, trifluoroethanesulfonic acid, perfluoroethylsulfonic acid, perfluoro(ethoxyethane)sulfonic acid, perfluoro(methoxyethane)sulfonic acid, dodecylsulfonic acid, perfluorododecylsulfonic acid, butanesulfonic acid, perfluorobutanesulfonic acid, propanesulfonic acid, perfluoropropanesulfonic acid, octylsulfonic acid, pefluorooctanesulfonic acid, methanedisulfonic acid, 2-methylpropanesulfonic acid, cyclohexylsulfonic acid, camphorsulfonic acids, perfluorohexanesulfonic acid, ethanedisulfonic acid, benzylsulfonic acid, hydroxyphenylmethanesulfonic acid, naphthylmethanesulfonic acid, norbornanesulfonic acids, benzenesulfonic acid, chlorobenzenesulfonic acids, bromobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids (e.g., p-toluenesulfonic acid), methylchlorobenzenesulfonic acids, dodecylbenzenesulfonic acids, butylbenzenesulfonic acids, cyclohexylbenzenesulfonic acids, picrylsulfonic acid, dichlorobenzenesulfonic acids, dibromobenzenesulfonic acids, and 2,4,5-trichlorobenzenesulfonic acid.

In some embodiments, the organic acid can be in an amount of at least about 0.01% by weight (e.g., at least about 0.05% by weight, at least about 0.1% by weight, at least about 0.12% by weight, at least about 0.14% by weight, at least about 0.16% by weight, at least about 0.18% by weight, or at least about 0.2% by weight) and/or at most about 0.5% by weight (e.g., at most about 0.4% by weight, at most about 0.3% by weight, at most about 0.2% by weight, at most about 0.18% by weight, or at most about 0.16% by weight) of the composition. Without wishing to be bound by theory, it is believed that the organic acid can serve as a chelating agent in the cleaning composition to facilitate the removal of post etch and/or post ashing residues.

The cleaning compositions of this disclosure optionally contain at least one pH adjusting agent (e.g., an acid or a base) to control the pH to from about 7 to about 11. In some embodiments, the compositions of this disclosure can have a pH of at least about 7 (e.g., at least about 7.5, at least about 8, or at least about 8.5) to at most about 11 (e.g., at most about 10.5, at most about 10, at most about 9.5, at most about 9). Without wishing to be bound by theory, it is believed that a cleaning composition having a pH higher than 11 decreases the plasma etch residue cleaning to an impractical level for complete cleaning and that a pH lower than 7 would increase the etch rate of certain metals or dielectric materials to an undesirable level. The effective pH can vary depending on the types and amounts of the ingredients used in the compositions described herein.

The amount of the pH adjusting agent required, if any, can vary as the concentrations of the other components are varied in different formulations, particularly the hydroxylamine and the organic acid, and as a function of the molecular weight of the particular pH adjusting agent employed. In general, the pH adjusting agent concentration ranges from about 0.1% to about 3% by weight of the cleaning composition. In some embodiments, the cleaning compositions of this disclosure include at least about 0.1% by weight (e.g., at least about 0.5% by weight, at least about 1% by weight, or at least about 1.5% by weight) and/or at most about 3% by weight (e.g., at most about 2.5% by weight, at most about 2% by weight, or at most about 1.5% by weight) the pH adjusting agent.

In general, the pH adjusting agent is free of any metal ion (except for a trace amount of metal ion impurities). Suitable metal ion free pH adjusting agents include ammonium hydroxide, quaternary ammonium hydroxides, monoamines (including alkanolamines), diamines, triamines (such as diethylenetriamine pentaacetic acid (DTPA)), imines (such as 1,8-diazabicyclo[5.4.0]-7-undecene (DBU) and 1,5-diazabicyclo[4.3.0]-5-nonene), and guanidine salts (such as guanidine carbonate).

Examples of suitable quaternary ammonium hydroxides include, but are not limited to, tetramethyl ammonium hydroxide, tetraethyl ammonium hydroxide, tetrapropyl ammonium hydroxide, tetrabutyl ammonium hydroxide, dimethyldiethylammonium hydroxide, choline, tetraethanolammonium hydroxide, benzyltrimethylammonium hydroxide, benzyltriethylammonium hydroxide, and benzyltributylammonium hydroxide.

Examples of suitable monoamines include, but are not limited to, triethylamine, tributylamine, tripentylamine, ethanolamine, diethanolamine, diethylamine, butylamine, dibutylamine, and benzylamine.

In addition, in some embodiments, the cleaning compositions of the present disclosure may contain other additives such as, additional pH adjusting agents, corrosion inhibitors (e.g., a substituted or unsubstituted benzotriazole), surfactants, additional organic solvents, biocides, and defoaming agents as optional components.

Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference).

In some embodiments, the cleaning compositions of the present disclosure may specifically exclude one or more of the additive components, in any combination, if more than one. Such excluded components are selected from the group consisting of oxygen scavengers, quaternary ammonium hydroxides, amines, alkali metal and alkaline earth bases (such as NaOH, KOH, LiOH, magnesium hydroxide, and calcium hydroxide), surfactants other than a defoamer, fluoride containing compounds, oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, hydroxycarboxylic acids, carboxylic and polycarboxylic acids lacking amino groups, non-azole corrosion inhibitors, guanidine, guanidine salts, inorganic acids (e.g., sulfonic acids, sulfuric acid, sulfurous acid, nitrous acid, nitric acid, phosphorous acid, and phosphoric acid), pyrrolidone, polyvinyl pyrrolidone, metal halides, metal halides of the formula $W_zMX_y$, wherein W is selected from H, an alkali or alkaline earth metal, and a metal-ion-free hydroxide base moiety; M is a metal selected from the group consisting of Si, Ge, Sn, Pt, P, B, Au, Ir, Os, Cr, Ti, Zr, Rh, Ru and Sb; y is from 4 to 6; and z is 1, 2, or 3, and corrosion inhibitors other than those described in this disclosure.

In some embodiments, the cleaning compositions of the present disclosure are not specifically designed to remove bulk photoresist films from semiconductor substrates. Rather, the cleaning compositions of the present disclosure can be designed to remove all residues after bulk resist removal by dry or wet stripping methods. Therefore, in some embodiments, the cleaning method of the present disclosure is preferably employed after a dry or wet photoresist stripping process. This photoresist stripping process is generally preceded by a pattern transfer process, such as an etch or implant process, or is done to correct mask errors before pattern transfer. The chemical makeup of the residue will depend on the process or processes preceding the cleaning step.

Any suitable dry stripping process can be used to remove bulk resist from semiconductor substrates. Examples of suitable dry stripping processes include oxygen based plasma ashing, such as a fluorine/oxygen plasma or a $N_2/H_2$ plasma, ozone gas phase-treatment, fluorine plasma treatment, hot $H_2$ gas treatment (such as that described in U.S. Pat. No. 5,691,117 incorporated herein by reference in its entirety), and the like. In addition, any suitable conventional organic wet stripping solution known to a person skilled in the art can be used to remove bulk resist from semiconductor substrates.

A preferred stripping process used in combination with the cleaning method of the present disclosure is a dry stripping process. Preferably, this dry stripping process is an oxygen based plasma ashing process. Such a process removes most of the photoresist from the semiconductor substrate by applying a reactive-oxygen atmosphere at elevated temperatures (typically 250° C.) at vacuum conditions (i.e., 1 torr). Organic materials are oxidized by this process and are removed with the process gas. However, this process does not remove inorganic or organometallic contamination from the semiconductor substrate. A subsequent cleaning of the semiconductor substrate with the cleaning composition of the present disclosure is typically necessary to remove those residues.

In some embodiments, this disclosure features methods of cleaning residues from a semiconductor substrate. Such methods can be performed, for example, by contacting a semiconductor substrate containing post etch residues and/or post ashing residues with a cleaning composition described herein. The method can further include rinsing the semiconductor substrate with a rinse solvent after the contacting step and/or drying the semiconductor substrate after the rinsing step. In some embodiments, the semiconductor substrate can further include a material (e.g., an exposed material) or a layer of the material, where the material is selected from the group consisting of Cu, Co, W, AlOx, AlN, AlOxNy, Ti, TiN, Ta, TaN, TiOx, ZrOx, HfOx, and TaOx.

In some embodiments, the cleaning method includes the steps of:
(A) providing a semiconductor substrate containing post etch and/or post ashing residues;
(B) contacting said semiconductor substrate with a cleaning composition described herein;
(C) rinsing said semiconductor substrate with a suitable rinse solvent; and
(D) optionally, drying said semiconductor substrate by any means that removes the rinse solvent and does not compromise the integrity of said semiconductor substrate.

In some embodiments, the cleaning method further includes forming a semiconductor device (e.g., an integrated circuit device such as a semiconductor chip) from the semiconductor substrate obtained by the method described above.

The semiconductor substrates to be cleaned in this method can contain organic and organometallic residues, and additionally, a range of metal oxides that need to be removed. Semiconductor substrates typically are constructed of silicon, silicon germanium, Group III-V compounds like GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, tungsten, and their alloys. Said semiconductor substrate can also contain layers of interlayer dielectrics, silicon oxide, silicon nitride, silicon carbide, titanium oxide, and carbon doped silicon oxides.

The semiconductor substrate can be contacted with a cleaning composition by any suitable method, such as placing the cleaning composition into a tank and immersing and/or submerging the semiconductor substrates into the cleaning composition, spraying the cleaning composition onto the semiconductor substrate, streaming the cleaning composition onto the semiconductor substrate, or any combinations thereof. Preferably, the semiconductor substrates are immersed into the cleaning composition.

The cleaning compositions of the present disclosure may be effectively used up to a temperature of about 90° C. (e.g., from about 25° C. to about 80° C., from about 30° C. to about 60° C., or from about 40° C. to about 60° C.).

Similarly, cleaning times can vary over a wide range depending on the particular cleaning method and temperature employed. When cleaning in an immersion batch type process, a suitable time range is, for example, up to about 60 minutes (e.g., from about 1 minute to about 60 minutes, from about 3 minutes to about 20 minutes, or from about 4 minutes to about 15 minutes).

Cleaning times for a single wafer process may range from about 10 seconds to about 10 minutes (e.g., from about 15 seconds to about 9 minutes, from about 15 seconds to about 5 minutes, or from about 20 seconds to about 2 minutes).

To further promote the cleaning ability of the cleaning composition of the present disclosure, mechanical agitation means may be employed. Examples of suitable agitation means include circulation of the cleaning composition over the substrate, streaming or spraying the cleaning composition over the substrate, and ultrasonic or megasonic agitation during the cleaning process. The orientation of the semiconductor substrate relative to the ground may be at any angle. Horizontal or vertical orientations are preferred.

The cleaning compositions of the present disclosure can be used in conventional cleaning tools known to those skilled in the art. A significant advantage of the compositions of the present disclosure is that they include relatively non-toxic, non-corrosive, and non-reactive components in whole or in part, whereby the compositions are stable in a wide range of temperatures and process times. The compositions of the present disclosure are chemically compatible with practically all materials used to construct existing and proposed semiconductor wafer cleaning process tools for batch and single wafer cleaning.

Subsequent to the cleaning, the semiconductor substrate can be rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidone, gamma-butyrolactone, dimethyl sulfoxide, ethyl lactate, and propylene glycol monomethyl ether acetate. Alternatively, aqueous rinses with pH>8 (such as dilute aqueous ammonium hydroxide) may be employed. Preferred examples of rinse solvents include, but are not limited to, dilute aqueous ammonium hydroxide, DI water, methanol, ethanol, and isopropyl alcohol. The solvent may be applied using means similar to that used in applying a cleaning composition described herein. The cleaning composition may have been removed from the semiconductor substrate prior to the start of the rinsing step or it may still be in contact with the semiconductor substrate at the start of the rinsing step. Preferably, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, heating the semiconductor substrate with a heating means such as a hotplate or infrared lamp, Marangoni drying, Rotagoni drying, IPA drying, or any combinations thereof. Drying times will be dependent on the specific method employed but are typically on the order of 30 seconds up to several minutes.

In some embodiments, a method of manufacturing an integrated device using a cleaning composition described herein can include the following steps. First, a layer of a photoresist is applied to a semiconductor substrate. The semiconductor substrate thus obtained can then undergo a pattern transfer process, such as an etch or implant process, to form an integrated circuit. The bulk of the photoresist can then be removed by a dry or wet stripping method (e.g., an oxygen based plasma ashing process). Remaining residues on the semiconductor substrate can then be removed using a cleaning composition described herein in the manner described above. The semiconductor substrate can subsequently be processed to form one or more additional circuits on the substrate or can be processed to form into a semiconductor chip by, for example, assembling (e.g., dicing and bonding) and packaging (e.g., chip sealing).

The contents of all publications cited herein (e.g., patents, patent application publications, and articles) are hereby incorporated by reference in their entirety.

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a 1 inch stirring bar at 300 rpm unless otherwise noted.

General Procedure 1

Formulation Blending

Cleaning compositions of the disclosure were prepared by mixing, while stirring, the organic solvents and ultra-pure deionized water (DIW). After a uniform solution was achieved, the remaining components were added. All components used were commercially available and of high purity.

General Procedure 2

Cleaning Evaluation with Beaker Test

The cleaning of PER (Post Etch Residue) from a substrate was carried out with the above-described cleaning compositions using a multilayered substrate of Photoresist/TiOx/SiN/Co/ILD (ILD=Inter Layer Dielectric) or photoresist/TiOx/SiN/W/ILD that had been patterned lithographically, etched in a plasma metal etcher, and followed by oxygen plasma ashing to remove the top layer of photoresist completely.

The test coupons were held using 4" long plastic locking tweezers, whereby the coupon could then be suspended into a 500 ml volume glass beaker containing approximately 200 milliliters of a cleaning composition of the present disclosure. Prior to immersion of the coupon into the cleaning composition, the composition was pre-heated to the desired test condition temperature (typically 40° C. or 60° C. as noted) with controlled stirring. The cleaning tests were then carried out by placing the coupon which was held by the plastic tweezers into the heated composition in such a way that the PER layer containing side of the coupon faced the stir bar. The coupon was left static in the cleaning composition for a time period (typically 2 to 5 minutes) while the composition was kept at the test temperature under controlled stirring. When the desired cleaning time was completed, the coupon was quickly removed from the cleaning composition and placed in a 500 ml plastic beaker filled with approximately 400 ml of DI water at ambient temperature (~17° C.) with gentle stirring. The coupon was left in the beaker of DI water for approximately 30 seconds, and then quickly removed, and rinsed under a DI water stream at ambient temperature for about 30 seconds. The coupon was immediately exposed to a nitrogen gas stream from a hand held nitrogen blowing gun, which caused any droplets on the coupon surface to be blown off the coupon, and further, to completely dry the coupon device surface. Following this final nitrogen drying step, the coupon was removed from the plastic tweezers holder and placed into a covered plastic carrier with the device side up for short term storage no greater than about 2 hours. The scanning electron microscopy (SEM) images were then collected for key features on the cleaned test coupon device surface.

General Procedure 3

Materials Compatibility Evaluation with Beaker Test

The blanket Co on silicon substrate, W on silicon substrate, TiOx on $SiO_2$ on silicon substrate, SiN on silicon substrate, ILD on silicon substrate, SiC on silicon substrate, and W alloy on silicon substrate were diced into approximately 1 inch×1 inch square test coupons for the materials compatibility tests. The test coupons were initially measured for thickness or sheet resistance by the 4-point probe, CDE Resmap 273 for metallic film (Co, W), or by ellipsometry for dielectric film (TiOx, SiN and ILD) using a Woollam M-2000X. The test coupons were then installed on the 4" long plastic locking tweezers and treated as described in the cleaning procedure in General Procedure 2 with the Co, W, W alloy, TiOx, SiN, SiC, or ILD layer containing side of the coupon faced the stir bar for 10 minutes.

After the final nitrogen drying step, the coupon was removed from the plastic tweezers holder and placed into a covered plastic carrier. The post-thickness or sheet resistance was then collected on the post-processing test coupon surface by the 4-point probe, CDE Resmap 273 for metallic film (Co, W, and W alloy) or by Elipsometry for dielectric film (TiOx, SiN, SiC, and ILD) using a Woollam M-2000X.

Formulation Examples FE-1 to FE-3

Table 1 includes formulations FE-1 to FE-3 (which included a sulfur-containing additive) prepared by General Procedure 1. In Tables 1-6, "DEGBE" refers to diethylene glycol butyl ether; "Hex glycol" refers to hexylene glycol; "MSA" refers to methanesulfonic acid; and "DTPA" refers to diethylenetriamine pentaacetic acid.

TABLE 1

| Ex. | Hydroxyl-amine | First organic solvent | Second organic solvent | Boron-containing compound | Organic acid | Water | pH |
|---|---|---|---|---|---|---|---|
| FE-1 | 9% | Hex glycol 67% | DEGBE 10% | Boric acid 0.015% | MSA 0.036% | 14% | 8.79-8.93 |
| FE-2 | 10% | Hex glycol 5% | Sulfolane 74% | Boric acid 0.005% | None | 11% | N/A |
| FE-3 | 10% | Hex glycol 20% | Sulfolane 59% | Boric acid 0.005% | None | 11% | N/A |

"NA" refers to data not available.

Examples 1-3

Compatibility of Cleaners with Exposed Metals or Dielectrics

Formulations FE-1, FE-2, and FE-3 were tested for cleaning ability according to General Procedure 2 and for materials compatibility according to General Procedure 3 at 65° C. for 4 minutes. Multiple samples of each formulation were tested. The results show that these formulations remove post etch/ashing residues sufficiently. The etch rates (ER) (Angstroms/minute) of TiOx, W alloy, Co, SiN, ILD, W, $Al_2O_3$, SiC, and tetraethylorthosilicate (TEOS) by the cleaning compositions are shown in Table 2.

TABLE 2

| Ex. | TiOx | W alloy | Co | SiN | ILD | W | $Al_2O_3$ | SiC | TEOS |
|---|---|---|---|---|---|---|---|---|---|
| FE-1 | 1.7-2.4 | 1.5-3.0 | 0.4-1.1 | N/A | N/A | N/A | N/A | N/A | N/A |
| FE-2 | 1.5-2.6 | 2.0-5.3 | 0-0.4 | 0-0.3 | 0 | 0.7-1.0 | 0 | 0 | 0.2-0.4 |
| FE-3 | 1.6-2.0 | 2.7-4.6 | 0.2-1.2 | N/A | N/A | N/A | N/A | N/A | N/A |

"NA" refers to data not available.

The data in Table 2 show that formulations of this disclosure (i.e., FE-1, FE-2, and FE-3) did not significantly etching the semiconductor materials (such as TiOx, Co, W, SiN, ILD, $Al_2O_3$, SiC, and TEOS) typically found in semiconductor devices that are not intended to be removed. In addition, it appears that sulfolane used in FE-2 helped reduce Co etch rate.

Formulation Examples FE-4 to FE-11 and CFE-1 to CFE4

Table 3 includes formulations FE-4 to FE-11 and comparative formulations CFE-1 to CFE-4 prepared by General Procedure 1.

TABLE 3

| Ex. | Hydroxyl-amine | First organic solvent | Second organic solvent | Boron-containing compound | Additive | Water |
|---|---|---|---|---|---|---|
| CFE-1 | 10% | DEGBE 80% | None | None | None | 10% |
| CFE-2 | 10% | DEGBE 80% | None | None | Benzoguanamine 0.2% | 10% |
| CFE-3 | 10% | DEGBE 80% | None | None | Benzoguanamine 0.4% | 10% |
| CFE-4 | 10% | Sulfolane 80% | None | None | None | 10% |
| FE-4 | 10% | DEGBE 80% | None | Boric acid 0.05% | None | 10% |
| FE-5 | 10% | DEGBE 80% | None | Boric acid 0.1% | None | 10% |
| FE-6 | 10% | DEGBE 80% | None | Phenyl boronic acid 0.05% | None | 10% |
| FE-7 | 10% | DEGBE 80% | None | Phenyl boronic acid 0.1% | None | 10% |
| FE-8 | 10% | Sulfolane 80% | None | Phenyl boronic acid 0.05% | None | 10% |
| FE-9 | 10% | Sulfolane 80% | None | Phenyl boronic acid 0.1% | None | 10% |
| FE-10 | 10% | Sulfolane 60% | Hex glycol 20% | Boric acid 0.05% | None | 10% |
| FE-11 | 10% | Sulfolane 60% | Hex glycol 20% | Boric acid 0.1% | None | 10% |

Examples 4-11 and Comparative Examples 1-4

Compatibility of Cleaners with Exposed Metals

Formulations FE-4 to FE-11 and Comparative formulations CFE-1 to CFE-4 were tested for cleaning ability according to General Procedure 2 and for materials compatibility according to General Procedure 3 at 65° C. for 4 minutes. The etch rates (ER) (Angstroms/minute) of TiOx, W alloy, and Co by the cleaning compositions are shown in Table 4.

TABLE 4

| Ex. | TiOx | W alloy | Co |
|---|---|---|---|
| CFE-1 | 1.3 | 10 | 4.2 |
| CFE-2 | 0.9 | 7.9 | 2.9 |
| CFE-3 | 0.7 | 7.1 | 2.4 |
| CFE-4 | 1.6 | 7.6 | 2.9 |
| FE-4 | 0.5 | 7.8 | 0 |
| FE-5 | 0.2 | 6.3 | 0 |
| FE-6 | 0.6 | 7.9 | 0 |
| FE-7 | 0.4 | 7.2 | 0 |
| FE-8 | 0.9 | >13 | 2.0 |
| FE-9 | 1.4 | >13 | 2.6 |
| FE-10 | 1.0 | 4.5 | 0.3 |
| FE-11 | 1.0 | 3.6 | 0 |

The data in Table 4 show that comparative formulations without a boron-containing compound (i.e., CFE-1 to CFE-4) generally exhibited relatively high etch rates toward Co. By contrast, the cleaning formulations of this disclosure (i.e., FE-4 to FE-11), which contained a boron-containing compound, exhibited a surprisingly low Co etch rate. Thus, the cleaning formulations of this disclosure could be used to clean the post etch/ashing residues without significantly etching exposed Co found in semiconductor devices that is not intended to be removed.

Formulation Examples FE-12 to FE-13 and CFE-5 to CFE6

Table 5 includes formulations FE-12 to FE-13 and comparative formulations CFE-5 to CFE-6 prepared by General Procedure 1.

TABLE 5

| Ex. | Hydroxyl-amine | First organic solvent | Second organic solvent | Boron-containing compound | Organic Acid | Additive | Water | PH |
|---|---|---|---|---|---|---|---|---|
| FE-12 | 9% | Hex glycol 67% | DEGBE 10% | Boric acid 0.015% | MSA 0.0361% | None | 14% | 9 |
| FE-13 | 9% | Hex glycol 67% | DEGBE 10% | Boric acid 0.015% | MSA 0.0361% | None | 14% | 9 |
| CFE-5 | 9% | Hex glycol 67% | DEGBE 10% | None | MSA 0.0521% | DTPA 0.01% | 14% | 9.03 |
| CFE-6 | 9% | Hex glycol 67% | DEGBE 10% | None | MSA 0.0532% | DTPA 0.02% | 14% | 9.03 |

Examples 12-13 and Comparative Examples 5-6

Compatibility of Cleaners with Exposed Metals

Formulations FE-12 to FE-13 and Comparative formulations CFE-5 to CFE-6 were tested for cleaning ability according to General Procedure 2 and for materials compatibility according to General Procedure 3 at 65° C. for 4 minutes. The etch rates (ER) (Angstroms/minute) of TiOx, W alloy, and Co by the cleaning compositions are shown in Table 6.

TABLE 6

| Ex. | TiOx | W alloy | Co |
|---|---|---|---|
| FE-12 | 1.8 | 1.9 | 0.9 |
| FE-13 | 1.6 | 0.9 | 0.8 |
| CFE-5 | 2.3 | 1.9 | 3.5 |
| CFE-6 | 1.9 | 3.7 | 4.1 |

The data in Table 6 show that comparative formulations without a boron-containing compound (i.e., CFE-5 to CFE-6) generally exhibited relatively high etch rates toward Co. By contrast, the cleaning formulations of this disclosure (i.e., FE-12 to FE-13), which contained a boron-containing compound, exhibited a surprisingly low Co etch rate. Thus, the cleaning formulations of this disclosure could be used to clean the post etch/ashing residues without significantly etching exposed Co found in semiconductor devices that is not intended to be removed.

While the disclosure has been described in detail with reference to certain embodiments thereof, it is understood that modifications and variations are within the spirit and scope of that which is described and claimed.

What is claimed is:

1. A cleaning composition, comprising:
    1) hydroxylamine;
    2) at least one organic solvent selected from the group consisting of water soluble alcohols, water soluble ketones, water soluble esters, water soluble sulfones, and water soluble ethers;
    3) at least one boron-containing compound selected from the group consisting of boric acid, boronic acids, and salts thereof; and
    4) water;
    wherein the composition is free of a metal halide and an oxidizing agent.

2. The composition of claim 1, wherein the composition has a pH from about 7 to about 11.

3. The composition of claim 1, wherein the hydroxylamine is from about 0.5% to about 20% by weight of the composition.

4. The composition of claim 1, wherein the composition comprises two organic solvents.

5. The composition of claim 4, wherein the two organic solvents are each independently selected from the group consisting of alkylene glycols, alkylene glycol ethers, and sulfones.

6. A cleaning composition, comprising:
    1) at least one redox agent;
    2) two organic solvents;
    3) at least one boron-containing compound selected from the group consisting of boric acid, boronic acids, and salts thereof; and
    4) water;
    wherein the two organic solvents are each independently selected from the group consisting of hexylene glycol, diethylene glycol butyl ether, and sulfolane.

7. The composition of claim 1, wherein the at least one organic solvent is from about 60% to about 95% by weight of the composition.

8. The composition of claim 1, further comprising at least one organic acid.

9. The composition of claim 8, wherein the at least one organic acid comprises a carboxylic acid or a sulfonic acid.

10. The composition of claim 9, wherein the at least one organic acid comprises methanesulfonic acid.

11. The composition of claim 8, wherein the at least one organic acid is from about 0.01% to about 0.5% by weight of the composition.

12. The composition of claim 1, wherein the at least one boron-containing compound comprises boric acid.

13. A cleaning composition, comprising:
    1) at least one redox agent;
    2) at least one organic solvent selected from the group consisting of water soluble alcohols, water soluble ketones, water soluble esters, water soluble sulfones, and water soluble ethers;
    3) at least one boron-containing compound selected from the group consisting of boric acid, boronic acids, and salts thereof; and
    4) water;
    wherein the at least one boron-containing compound comprises a boronic acid of formula (I):

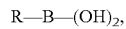

in which R is $C_1$-$C_{10}$ alky or aryl.

14. The composition of claim 13, wherein R is phenyl.

15. The composition of claim 1, wherein the boron-containing compound is from about 0.001% to about 0.2% by weight of the composition.

16. The composition of claim 1, wherein the water is from about 5% to about 28% of the composition.

17. A method, comprising:
  contacting a semiconductor substrate containing post etch residues or post ashing residues with a cleaning composition comprising:
  1) at least one redox agent;
  2) at least one organic solvent selected from the group consisting of water soluble alcohols, water soluble ketones, water soluble esters, water soluble sulfones, and water soluble ethers;
  3) at least one boron-containing compound selected from the group consisting of boric acid, boronic acids, and salts thereof; and
  4) water;
  wherein the composition is free of a metal halide.

18. The method of claim 17, wherein the semiconductor substrate further comprises a layer comprising a material selected from the group consisting of Cu, Co, W, AlOx, AlN, AlOxNy, Ti, TiN, Ta, TaN, TiOx, ZrOx, HfOx, and TaOx.

19. The method of claim 17, further comprising rinsing the semiconductor substrate with a rinse solvent after the contacting step.

20. The method of claim 19, further comprising drying the semiconductor substrate after the rinsing step.

21. The method of claim 17, further comprising forming a semiconductor device from the semiconductor substrate.

22. The method of claim 17, wherein the composition has a pH from about 7 to about 11.

23. The method of claim 17, wherein the at least one redox agent comprises hydroxylamine.

24. The method of claim 17, wherein the at least one redox agent is from about 0.5% to about 20% by weight of the composition.

25. The method of claim 17, wherein the composition comprises two organic solvents.

26. The method of claim 25, wherein the two organic solvents are each independently selected from the group consisting of alkylene glycols, alkylene glycol ethers, and sulfones.

27. The method of claim 26, wherein the two organic solvents are each independently selected from from the group consisting of hexylene glycol, diethylene glycol butyl ether, and sulfolane.

28. The method of claim 17, wherein the at least one organic solvent is from about 60% to about 95% by weight of the composition.

29. The method of claim 17, wherein the composition further comprises at least one organic acid.

30. The method of claim 29, wherein the at least one organic acid comprises a carboxylic acid or a sulfonic acid.

31. The method of claim 30, wherein the at least one organic acid comprises methanesulfonic acid.

32. The method of claim 29, wherein the at least one organic acid is from about 0.01% to about 0.5% by weight of the composition.

33. The method of claim 17, wherein the at least one boron-containing compound comprises boric acid.

34. The method of claim 17, wherein the at least one boron-containing compound comprises a boronic acid of formula (I):

$$R-B-(OH)_2,$$

in which R is $C_1$-$C_{10}$ alky or aryl.

35. The method of claim 34, wherein R is phenyl.

36. The method of claim 17, wherein the boron-containing compound is from about 0.001% to about 0.2% by weight of the composition.

37. The method of claim 17, wherein the water is from about 5% to about 28% of the composition.

* * * * *

UNITED STATES PATENT AND TRADEMARK OFFICE
CERTIFICATE OF CORRECTION

| | | |
|---|---|---|
| PATENT NO. | : 10,626,353 B2 | Page 1 of 1 |
| APPLICATION NO. | : 15/890398 | |
| DATED | : April 21, 2020 | |
| INVENTOR(S) | : Emil A. Kneer and Yasuo Sugishima | |

It is certified that error appears in the above-identified patent and that said Letters Patent is hereby corrected as shown below:

In the Claims

<u>Column 18</u>
Line 61, Claim 13, delete "alky" and insert -- alkyl --

<u>Column 20</u>
Line 6, Claim 27, delete "from from" and insert -- from --
Line 27, Claim 34, delete "alky" and insert -- alkyl --

Signed and Sealed this
Thirtieth Day of June, 2020

Andrei Iancu
*Director of the United States Patent and Trademark Office*